United States Patent
Goerlach

(10) Patent No.: US 7,671,379 B2
(45) Date of Patent: Mar. 2, 2010

(54) SEMICONDUCTOR SYSTEM FOR VOLTAGE LIMITATION

(75) Inventor: Alfred Goerlach, Kusterdingen (DE)

(73) Assignee: Robert Bosch GmbH, Stuttgart (DE)

(*) Notice: Subject to any disclaimer, the term of this patent is extended or adjusted under 35 U.S.C. 154(b) by 191 days.

(21) Appl. No.: 11/662,614

(22) PCT Filed: Jul. 15, 2005

(86) PCT No.: PCT/EP2005/053402

§ 371 (c)(1),
(2), (4) Date: Nov. 6, 2007

(87) PCT Pub. No.: WO2006/029921

PCT Pub. Date: Mar. 23, 2006

(65) Prior Publication Data

US 2008/0191306 A1    Aug. 14, 2008

(30) Foreign Application Priority Data

Sep. 13, 2004   (DE) .................. 10 2004 044 141

(51) Int. Cl.
*H01L 29/78* (2006.01)
(52) U.S. Cl. ................ 257/121; 257/E29.172
(58) Field of Classification Search ........... 257/687, 257/712, 722, E23.057
See application file for complete search history.

(56) References Cited

U.S. PATENT DOCUMENTS

| 4,074,303 | A |   | 2/1978 | Benda et al. |
|-----------|---|---|--------|--------------|
| 4,587,547 | A | * | 5/1986 | Amemiya et al. ........... 257/655 |
| 5,142,347 | A | * | 8/1992 | Voss ........................... 257/109 |
| 5,162,876 | A | * | 11/1992 | Kitagawa et al. ............ 257/138 |
| 6,180,444 | B1 | * | 1/2001 | Gates et al. ................. 438/237 |

FOREIGN PATENT DOCUMENTS

| DE | 25 06 102 | 8/1976 |
| DE | 30 08 034 | 11/1980 |
| DE | 36 31 136 | 3/1988 |
| EP | 0 485 059 | 5/1992 |
| EP | 1 191 594 | 3/2002 |

OTHER PUBLICATIONS

International Search Report, PCT International Patent Application No. PCT/EP2005/053402, dated Oct. 20, 2005.

* cited by examiner

*Primary Examiner*—Thomas L Dickey
(74) *Attorney, Agent, or Firm*—Kenyon & Kenyon LLP

(57) ABSTRACT

A semiconductor system for voltage limitation includes a first cover electrode, a highly p-doped semiconductor layer that is connected to the first cover electrode, a slightly n-doped semiconductor layer that is connected to the highly p-doped semiconductor layer and a second cover electrode. At least one p-doped semiconductor layer and two highly n-doped semiconductor layers are provided next to one another in an alternating sequence between the slightly n-doped semiconductor layer and the second cover electrode.

28 Claims, 2 Drawing Sheets

Section AB

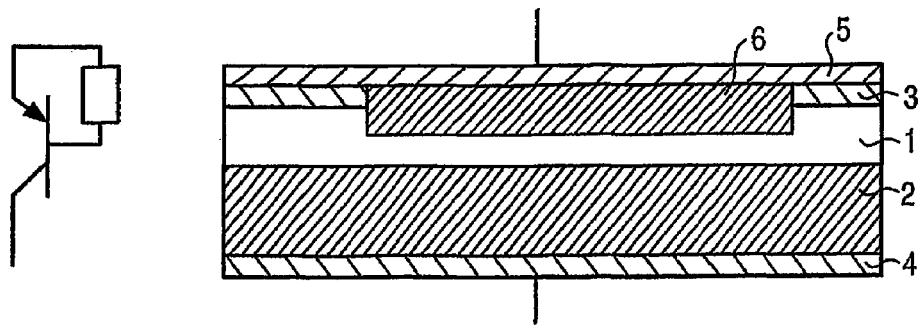
Fig. 3
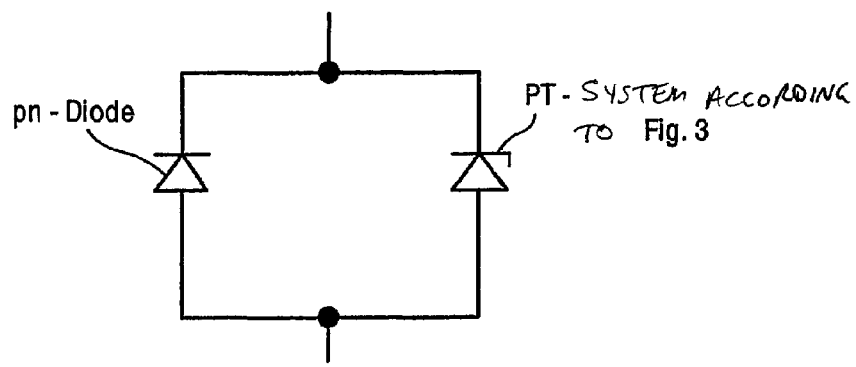
Fig. 4
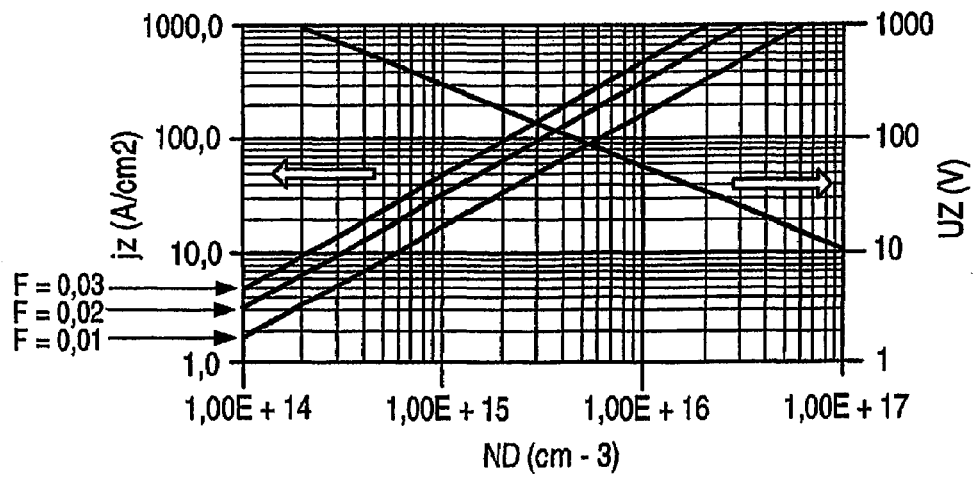

SEMICONDUCTOR SYSTEM FOR VOLTAGE LIMITATION

FIELD OF THE INVENTION

The present invention relates to a semiconductor system for voltage limitation.

BACKGROUND INFORMATION

The use of semiconductor diodes for voltage limitation is conventional. Such a conventional semiconductor diode is shown in FIG. 1. This semiconductor diode is a pn diode, a p-doped layer 2 having been diffused into a homogeneously n-doped region 1. In order to reduce the bulk resistance and to improve the ohmic connection of the n-type semiconductor to the metal plating, n-doped region 1is highly n-doped from the back of the wafer as an n$^+$ doping (region 3). Reference numerals 4 and 5 denote metal layers. If a reverse voltage US is applied to such a diode, the current increases strongly as soon as breakdown voltage UZ is exceeded. The cause of the current increase and accordingly of the voltage limitation is based on the onset of the avalanche effect. When a reverse voltage is applied, a space charge region forms at the pn boundary surface. From a specific electrical field strength $E_{crit}$ of approximately $2 \cdot 10^5$ through $4 \cdot 10^5$ V/cm, charge carriers in the space charge region are accelerated so strongly that when they strike the crystal lattice, they break open bonds of the semiconductor and thus produce additional electrons and holes, which for their part are accelerated and are able to break open additional bonds. As a result, the current increases steeply.

A disadvantage of such diodes is that the breakdown voltage increases as the temperature rises. It possesses a positive temperature coefficient TK. If such a diode is briefly operated at high currents in breakdown, the power occurring as heat, the product of breakdown current IZ and breakdown voltage UZ may be very high. In diodes used in motor vehicle generators for rectification, powers in the range of several kilowatts occur during load-dump operation. As a consequence, the diode heats up and breakdown voltage UZ rises strongly. This is disadvantageous for many applications. For example, the maximum acceptable voltage in future 42-V electrical systems is only 58 V. Because the generator voltage in such systems may rise to 48 V, the temperature coefficient of the breakdown voltage must be negligibly small. In this connection, it should be noted that in addition to the influence of temperature on the breakdown voltage, it is also necessary to consider the bulk resistance and manufacturing tolerances.

SUMMARY

In contrast, a semiconductor system having the features described that its breakdown voltage is nearly independent of temperature. This is achieved by a semiconductor system that is a combination of a pn diode and a punchthrough diode, the latter also being described below as a PT-diode. A PT diode has only one npn or pnp structure and when sized properly, it shows only a slight temperature dependence of its limiting voltage UZPT. This limiting voltage of the PT diode is constantly selected to be lower than breakdown voltage UZPN of the pn-diode. The breakdown voltage of the entire semiconductor system is then the limiting voltage of the PT diode. Additional features of example embodiments of the present invention are described in more detail below with reference to the appended Figures.

BRIEF DESCRIPTION OF THE DRAWINGS

FIG. 3 shows a schematic representation and circuit diagram of a semiconductor system according to an example embodiment of the present invention.

FIG. 4 shows a circuit diagram of an example embodiment of the present invention, a conventional pn-diode and the system shown in FIG. 3 being connected in parallel.

FIG. 5 shows a diagram which illustrates maximum attainable breakdown current density jz and maximum attainable breakdown voltage UZ as a function of the doping concentration of region 1 for three different current error factors F.

DETAILED DESCRIPTION

Figure 2:
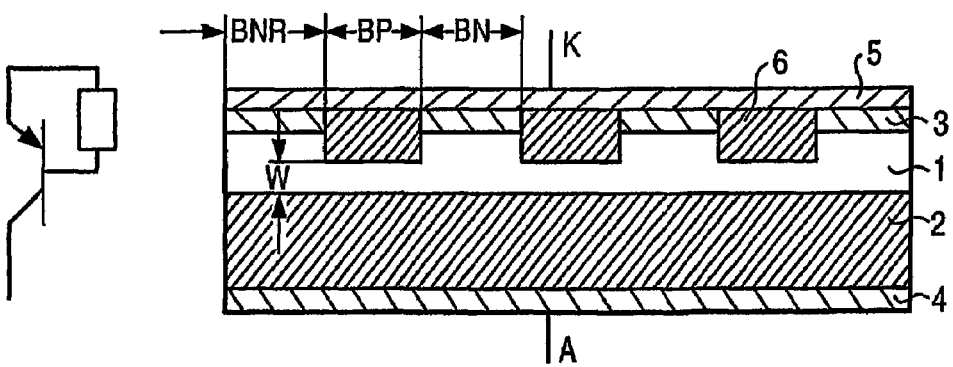
FIG. 2 shows a schematic representation and circuit diagram of a semiconductor system according to an example embodiment of the present invention.

FIG. 2 shows a schematic representation and circuit diagram of a semiconductor system according to an example embodiment of the present invention.

In this example embodiment, a slightly n-doped semiconductor layer 1 is provided over the entire surface of highly p-doped semiconductor layer 2. p-doped semiconductor layers 6 and highly n-doped semiconductor layers 3 are incorporated from the surface into this slightly n-doped semiconductor layer 1 in an alternating sequence so that at least p-doped semiconductor layers 6 and 2 do not contact one another. The n-doped semiconductor layer 3 may be located at the outer edge of the semiconductor system implemented in the form of a chip and may completely surround this edge. The top and the bottom of the shown semiconductor system are provided with thin metal layers 5 and 4. These unstructured metal platings form the ohmic contact to the semiconductor system. Metal contact 4 is designated as an anode and metal contact 5 as a cathode.

When a voltage is applied between anode 4 and cathode 5 such that the positive pole is connected to the anode and the negative pole to the cathode, i.e., in forward poling of the system, a current flows via the metal and semiconductor regions 4→2→1→3→5 after diffusion voltage UD is overcome.

If the voltage or polarity is reversed, the flow of current is interrupted except for a slight cutoff current. If this voltage is increased, the space charge region at pn junction 2/1 expands further into n-region 1. The edge of the space charge region reaches p-doped semiconductor region 6at a voltage that is lower than avalanche breakdown voltage UZPN of pn junction 2/1 . If the space charge region strikes layer 6 at voltage UZPT, current begins to flow via layers 4→2→1→6→5. The condition for a breakdown has been reached. This voltage UZPT is nearly independent of temperature.

The following equation applies to the current dependence of voltage UZPT while disregarding the bulk resistances:

$$UZPT = \frac{q \cdot ND \cdot W^2}{2 \cdot \varepsilon s \cdot \varepsilon 0} + \frac{W^2}{2 \cdot \varepsilon s \cdot \varepsilon 0 \cdot vs} \cdot jz \quad (1)$$

where:
elementary charge $q = 1.6 \cdot 10^{-19}$ As;
relative dielectric constant for silicon $\varepsilon s = 11.9$;
absolute dielectric constant $\varepsilon 0 = 8.854 \cdot 10^{-14}$ F/cm;
saturation velocity of the charge carriers $vs \approx 10^7$ cm/s;

ND=doping concentration of layer 1;
W=distance between regions 6 and 2 (this corresponds to the maximum space charge width in slightly n-doped region 1); and
jz=breakdown current density.

These aforementioned parameters are not or are only slightly temperature-dependent in the temperature range of interest, approximately −50° C.-220° C.

Doping concentration ND of layer 1 and width W of layer 1 are set such that punchthrough limiting voltage UZPT is lower than avalanche breakdown voltage UZPN of pn junction 21:

$$UZPT < UZPN \quad (2)$$

Furthermore, it must be ensured that breakdown voltage UCEO of the parasitic pnp transistor, which is made up of layers 6 (emitter), 1 (basis) and 2 (collector), does not fall below punchthrough limiting voltage UZPT.

$$UZPT < UCEO \quad (3)$$

Using a fit parameter n, which lies approximately between 4 and 7, it is possible to express breakdown voltage UCEO of the parasitic pnp transistor as a function of current amplification B in the emitter circuit as:

$$UCEO = \frac{UZPN}{\sqrt[n]{B+1}} \quad (4)$$

This requires that current amplification B of the pnp transistor must be selected to be very low. For the, e.g., preferably observed low widths W, current amplification B is practically only a function of emitter efficiency $\gamma_p$, since basis transport factor $\alpha$ assumes the value 1. The following applies to current amplification B:

$$B = \frac{\gamma_p}{1 - \gamma_{p\gamma}} \quad (5)$$

In the event that the widths of basis W and emitter WAE are substantially smaller in a pnp transistor than corresponding diffusion lengths Lp and Ln of the minority carriers, the emitter efficiency may be expressed approximately as:

$$\gamma_p = 1 \Big/ \left[ 1 + 3 \left( \int_W ND\,dx \Big/ \int_{WAE} NAE\,dx \right) \right] \quad (6)$$

NAE represents the concentration of the acceptors of the emitter. Emitter efficiency $\gamma_p$ and thus also current amplification B becomes small if concentration NAE is low or the width of emitter layer WAE is very small. The reduction of $\gamma_p$ at low WAE applies only to the case that WAE<Ln. The emitter concentration at the semiconductor surface may not be selected to be as low as desired, since otherwise metal-semiconductor connection 5, 6 will no longer have an ohmic character. For that reason, a very thin emitter layer, e.g., WAE<0.1 micrometers, must be selected in the system hereof in order to obtain low emitter efficiencies $\gamma_p$ and accordingly high voltages UCEO.

The current dependence of UZPT described in the second term of equation (1) may be minimized by suitable dimensioning of the system hereof. Factor F describes the maximum allowable current error.

$$F = \frac{USC}{UPT + USC} \quad (7)$$

UPT represents the first term and USC the second term of equation (1). Equation (7) shows that maximum achievable breakdown current density jz is a function of doping concentration ND of region 1 if factor F is selected. Maximum possible breakdown current density jz rises as doping concentration ND of region 1 increases and current error F increases. This is shown for three different current error factors F in FIG. 5. In addition, maximum attainable breakdown voltage UZ for a specific region of doping concentration ND is shown in FIG. 5. The approximation for the breakdown voltage of an abrupt pn junction is used which tends to produce low values. In addition, it is assumed that UCEO is not lower than UZPN.

Figure 1:
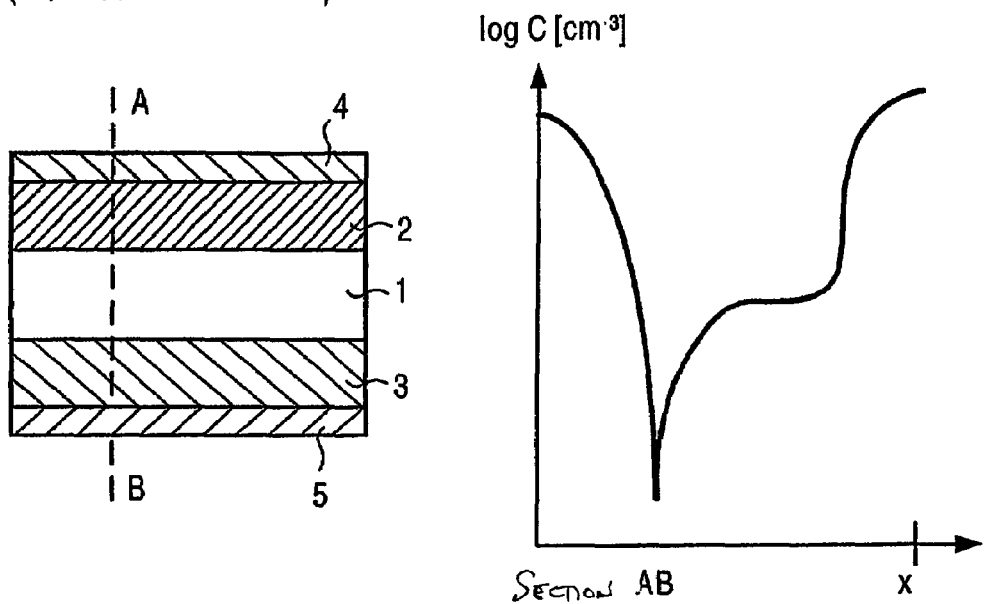
FIG. 1 shows a schematic representation of the cross section and the doping profile of a conventional pn diode.

In the conventional arrangement according to FIG. 1, the pn junction ends in the region of the sawing trench of the chip. As a function of the saw type and sawing process, the crystal lattice in this region is disturbed up to a depth of several micrometers to several tens of micrometers. This region of the disturbed crystal lattice is designated as a damage zone. Such regions have high densities of state in the band gap. As a result, the recombination probability for charge carriers and accordingly of the reverse current increases. In addition, the electrical field strength $E_{crit}$ required for triggering the avalanche effect is generally lower in the region of the damage zone than in the inner, undisturbed chip region. For that reason, the avalanche breakdown takes place first at the edge of the chip. The consequences of this are pre-breakdowns, which are expressed as rounded reverse characteristics. Due to the increased reverse currents and the pre-breakdowns in the edge regions, these regions are more strongly loaded thermally and electrically than in the inner region of the chip. This results in significantly reduced pulse strength of the diode.

In such diodes, it is therefore customary to ablate the disturbed chip region, for example, by etching in KOH.

In the system according to FIG. 2 and also according to FIG. 3, the pn junction also ends in the region of the disturbed sawing trench. Since in contrast to a conventional system, the voltage limitation no longer occurs at the pn junction but instead at the internal punchthrough structure, there is no reduction in pulse strength as long as conditions (2) and (3) also apply to the edge. According to an arrangement of the system, width BNR of region 3 in the region of the circumferential outer chip edge is greater than the region of the damage zone. Width BNR may, e.g., be selected to be greater than width BN of the internal highly n-doped regions 3.

Internal highly n-doped or p-doped regions 3 and 6, respectively, may be designed in various geometric arrangements, for example, as strips, circles or hexagons. Broad regions of regions 3 and 6 may be varied as a function of the particular application. In the case of a strip geometry, width BN of region 3 may be greater, smaller or equal to width BP of region 6.

In addition, widths BN and BP may vary strongly. Minimum widths BN and BP correspond roughly to the particular vertical penetration depths of the layers into region 1. When the maximum widths have been reached, only a coherent region 3 and 6 is present in each case. Maximum width BN is the difference between the length of the chip edge and minimum width BP. The other, more important boundary case is shown in FIG. 3. In the interior of the system, region 3 has been completely removed. The following then applies to region BP: length of the chip card minus two times width BNR. This arrangement is less suited for operation in the flow direction since it contains hardly any region of the pn diode component. However, it may be used as a punchthrough diode. In further example embodiments, the width of regions 3 and 6 BN and BP, respectively, need not be constant within the chip but instead may vary depending on position. Thus, BP may be very small in the vicinity of the chip edge, increase in the direction of the middle of the chip, etc. The number of p-doped regions 3 and n-doped regions 6 depends on the selection of the geometries described above and the dimensions of BNR, BN and BP. The depth of penetration of p-doped layer 6 may, as shown schematically in FIG. 2, be greater than the depth of penetration of n-doped layer 3; however, it may also be somewhat smaller or equal.

A possible, simple manufacturing process of the example embodiment according to FIG. 2 is indicated for a system having a breakdown voltage UZ of approximately 46 volts as may be used in 42-V motor vehicle electrical systems.

Such a diode may also be designed for higher or lower voltages. It is only necessary to provide that the width of the space charge region, distance W, is not too great. Otherwise, the second term in equation (1) has a disadvantageous effect at high current densities. FIG. 5 may be used to estimate maximum attainable breakdown voltage UZ as a function of the doping concentration.

For example, an n-doped layer having an effective thickness of 2.65-2.75 micrometers and a phosphorous doping material concentration $ND=8*10^{15}$ cm$^{-3}$ is deposited on a highly p-doped silicon substrate in an epitaxy process. Regions 3 and 6 are incorporated in a conventional manner using photo technology and ion implantation and cured, for example, using rapid thermal processing (RPT). To generate flat p-doped regions 6, a dosage of $2*10^{13}$ cm$^{-2}$ boron is implanted through a 30-nm thick diffusion oxide at an energy of 10 keV. Following that, the front and back are provided with a suitable metal system in a conventional manner. Before the metal plating process, p-doped layer 2 may be partially ground off in order to reduce the wafer thickness and accordingly the bulk resistance. If necessary, a, e.g., solderable metal plating such as Cr/NiV/Ag may be used. This makes it possible to solder the components on the front and back into a suitable housing, for example, a press-fit housing, such as is customarily used for diodes for motor vehicle rectifiers.

After the chips are separated and soldered into a press-fit housing, the damage zone on the chip edge may be removed if necessary by suitable wet chemical etching or gas phase etching in order to reduce the reverse currents caused by the damage zone.

Alternatively, it is also possible to manufacture a system according to FIG. 2 or FIG. 3 in which all doping types are exchanged, i.e., n-doped regions are replaced by p-doped regions and conversely.

An exemplary embodiment is shown in FIG. 4. A conventional system, for example, according to FIG. 1, is connected in parallel to a system hereof according to FIG. 3.

What is claimed is:

1. A semiconductor system for voltage limitation, comprising:
    a first cover electrode;
    a highly p-doped semiconductor layer connected to the first cover electrode;
    a slightly n-doped semiconductor layer directly connected to the highly p-doped semiconductor layer;
    a second cover electrode; and
    at least one p-doped semiconductor layer and two highly n-doped semiconductor layers provided next to one another in an alternating sequence, a first side of the at least one p-doped semiconductor layer and a first side of each highly n-doped semiconductor layer being directly connected to the slightly n-doped semiconductor layer, a second side of the at least one p-doped semiconductor layer and a second side of each highly n-doped semiconductor layer being directly connected to the second cover electrode.

2. The semiconductor system according to claim 1, wherein a distance of the p-doped semiconductor layer from the highly p-doped semiconductor layer is one of (a) smaller and (b) greater than or equal to a distance of the highly n-doped semiconductor layer from the highly p-doped semiconductor layer.

3. The semiconductor system according to claim 1, wherein the highly n-doped semiconductor layer completely encloses lateral edges of the semiconductor system.

4. The semiconductor system according to claim 3, wherein a width of the highly n-doped semiconductor layer in a region of the lateral edges of the semiconductor system is different from a width of the highly n-doped semiconductor layer in an inner region of the semiconductor system.

5. The semiconductor system according to claim 3, wherein the width of the highly n-doped semiconductor layer in the region of the lateral edges of the semiconductor system is greater than a region in which a crystal lattice of the semiconductor system is disturbed.

6. The semiconductor system according to claim 1, wherein the p-doped semiconductor layers provided in inner region of the semiconductor system and the highly n-doped semiconductor layers are arranged in the form of at least one of (a) strips, (b) circles and (c) hexagons.

7. The semiconductor system according to claim 1, wherein a width of the highly n-doped semiconductor layers is one of (a) greater than, (b) smaller than and (c) equal to a width of the p-doped semiconductor layers.

8. The semiconductor system according to claim 1, wherein a width of the highly n-doped semiconductor layers and widths of the p-doped semiconductor layers are different.

9. The semiconductor system according to claim 1, wherein distances of the highly n-doped semiconductor layers from one another and distances of the p-doped semiconductor layers from one another vary in each case.

10. The semiconductor system according to claim 1, wherein a width of the highly n-doped semiconductor layers in an inner region of the semiconductor system is greater than or equal to a depth of penetration of the highly n-doped semiconductor layers into the slightly n-doped semiconductor layer.

11. The semiconductor system according to claim 1, wherein a width of the p-doped semiconductor layers in an inner region of the semiconductor system is greater than or equal to a depth of penetration of the p-doped semiconductor layers into the slightly n-doped semiconductor layer.

12. The semiconductor system according to claim 1, wherein a single p-doped semiconductor layer surrounded by two highly n-doped semiconductor layers is arranged between the slightly n-doped semiconductor layer and the second cover electrode.

13. The semiconductor system according to claim 1, wherein a pn-diode is connected parallel to the semiconductor system.

14. The semiconductor system according to claim 1, wherein a doping concentration and a thickness of the slightly n-doped semiconductor layer defining a separation distance between the at least one p-doped semiconductor layer and the highly p-doped semiconductor layer are selected such that current flows as follows:
  when a first voltage having a first polarity is applied across the first cover electrode and the second cover electrode, from the first cover electrode to the highly p-doped semiconductor layer, to the slightly n-doped semiconductor layer, to each highly n-doped semiconductor layer, to the second cover electrode, and
  when a second voltage of opposite polarity to the first polarity is applied across the first cover electrode and the second cover electrode, from the first cover electrode to the highly p-doped semiconductor layer, to the slightly n-doped semiconductor layer, to the at least one p-doped semiconductor layer, to the second cover electrode.

15. A semiconductor system for voltage limitation, comprising:
  a first cover electrode;
  a highly n-doped semiconductor layer connected to the first cover electrode;
  a slightly p-doped semiconductor layer directly connected to the highly n-doped semiconductor layer;
  a second cover electrode; and
  an n-doped semiconductor layer and two highly p-doped semiconductor layers arranged next to one another in an alternating sequence, a first side of the n-doped semiconductor layer and a first side of each highly p-doped semiconductor layer being directly connected to the slightly p-doped semiconductor layer, a second side of the n-doped semiconductor layer and a second side of each highly p-doped semiconductor layer being directly connected to the second cover electrode.

16. The semiconductor system according to claim 15, wherein a distance of the n-doped semiconductor layer from the highly n-doped semiconductor layer is one of (a) smaller and (b) greater than or equal to a distance of the highly p-doped semiconductor layer from the highly n-doped semiconductor layer.

17. The semiconductor system according to claim 16, wherein the highly p-doped semiconductor layer completely encloses lateral edges of the semiconductor system.

18. The semiconductor system according to claim 17, wherein a width of the highly p-doped semiconductor layer in a region of the lateral edges of the semiconductor system is different from a width of the highly p-doped semiconductor layer in an inner region of the semiconductor system.

19. The semiconductor system according to claim 17, wherein a width of the highly p-doped semiconductor layer in a region of lateral edges of the semiconductor system is greater than a region in which a crystal lattice of the semiconductor system is disturbed.

20. The semiconductor system according to claim 15, wherein the n-doped semiconductor layers provided in a inner region of the semiconductor system and the highly p-doped semiconductor layers are arranged in the form of at least one of (a) strips, (b) circles and (c) hexagons.

21. The semiconductor system according to claim 15, wherein a width of the highly p-doped semiconductor layers is one of (a) greater than, (b) smaller than and (c) equal to a width of the n-doped semiconductor layers.

22. The semiconductor system according to claim 15, wherein a width of the highly p-doped semiconductor layers and widths of the n-doped semiconductor layers are different.

23. The semiconductor system according to claim 15, wherein distances of the highly p-doped semiconductor layers from one another and distances of the n-doped semiconductor layers from one another vary in each case.

24. The semiconductor system according to claim 15, wherein a width of the highly p-doped semiconductor layers in an inner region of the semiconductor system is greater than or equal to a depth of penetration of the highly p-doped semiconductor layers into the slightly p-doped semiconductor layer.

25. The semiconductor system according to claim 15, wherein a width of the n-doped semiconductor layers in an inner region of the semiconductor system is greater than or equal to a depth of penetration of the n-doped semiconductor layers into the slightly p-doped semiconductor layer.

26. The semiconductor system according to claim 15, wherein a single n-doped semiconductor layer surrounded by two highly p-doped semiconductor layers is provided between the slightly p-doped semiconductor layer and the second cover electrode.

27. The semiconductor system according to claim 15, wherein a pn-diode is connected parallel to the semiconductor system.

28. The semiconductor system according to claim 15, wherein a doping concentration and a thickness of the slightly p-doped semiconductor layer defining a separation distance between the n-doped semiconductor layer and the highly n-doped semiconductor layer are selected such that current flows as follows:
  when a first voltage having a first polarity is applied across the first cover electrode and the second cover electrode, from the first cover electrode to the highly n-doped semiconductor layer, to the slightly p-doped semiconductor layer, to each highly p-doped semiconductor layer, to the second cover electrode, and
  when a second voltage of opposite polarity to the first polarity is applied across the first cover electrode and the second cover electrode, from the first cover electrode to the highly n-doped semiconductor layer, to the slightly p-doped semiconductor layer, to the n-doped semiconductor layer, to the second cover electrode.

* * * * *